(12) United States Patent
Miura et al.

(10) Patent No.: US 6,545,267 B1
(45) Date of Patent: Apr. 8, 2003

(54) WAFER HOLDER OF ION IMPLANTATION APPARATUS

(75) Inventors: Ryuichi Miura, Chiba-ken (JP); Kazuhiko Tomaru, Gunma-ken (JP); Tsutomu Yoneyama, Gunma-ken (JP); Ryuichi Handa, Gunma-Ken (JP)

(73) Assignees: Applied Materials, Inc., Chiba-ken (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/466,848

(22) Filed: Dec. 20, 1999

(30) Foreign Application Priority Data

Dec. 21, 1998 (JP) ............................................. 10-362302

(51) Int. Cl.[7] .............................. H05H 3/02; G21K 5/10; G01N 3/02; F28F 7/00
(52) U.S. Cl. ................... 250/251; 250/442.11; 252/512; 73/856; 165/46; 165/185
(58) Field of Search ............................ 250/492.21, 251, 250/442.11; 252/512; 361/234; 73/556; 165/46, 185

(56) References Cited

U.S. PATENT DOCUMENTS

| | | |
|---|---|---|
| 4,139,051 A | 2/1979 | Addison |
| 5,082,596 A * | 1/1992 | Fukuda et al. ............... 252/511 |
| 5,229,037 A * | 7/1993 | Nakano et al. .............. 252/512 |
| 6,037,599 A * | 3/2000 | Takase et al. ........... 250/492.21 |

FOREIGN PATENT DOCUMENTS

| | | | |
|---|---|---|---|
| EP | 0 323 902 | | 7/1989 |
| JP | 10-177964-a | * | 6/1998 |

OTHER PUBLICATIONS

Patent Abstracts of Japan vol. 12, No. 474 (Dec. 12, 1988) Jp 63 193447.

Patent Abstracts of Japan vol. 11, No. 33 (Jan. 30, 1987) Jp 61 200658.

Patent Abstracts of Japan vol. 11 No.30 (Sep. 30, 1998) JP 10 177964.

* cited by examiner

*Primary Examiner*—Jack Berman
*Assistant Examiner*—Kalimah Fernandez
(74) *Attorney, Agent, or Firm*—Millen, White, Zelano & Branigan, P.C.

(57) ABSTRACT

Wafer holders disposed in the target chamber of an ion implantation apparatus, with each of the wafer holders comprising a wafer mount and an electrically conductive elastic body that is laid on the wafer mount and has a surface for holding a wafer thereon.

7 Claims, 4 Drawing Sheets

WAFER HOLDER OF ION IMPLANTATION APPARATUS

FIELD OF THE INVENTION

The present invention relates to a holder for supporting wafers to be processed which is installed in an ion implantation apparatus used in the manufacturing process of semiconductor devices and, more particularly, to a wafer holder having a electrically conductive elastic body that is installed in an ion implantation apparatus to ensure excellent workability and enhancement of wafer cooling efficiency.

BACKGROUND OF THE INVENTION

In general an ion implantation apparatus is comprised of a beam line part wherein ion beams are generated and an ion implantation part wherein the silicon wafers to be processed are irradiated with ion beams from the beam line part to undergo ion implantation. As to the ion implantation part, an ion implanting part having a target chamber (vacuum chamber) and a wafer holding wheel installed in the target chamber is widely known.

Such a wafer holding wheel is constituted of a hub installed in a target chamber so that it can rotate with a rocking motion and arms radiating from the hub in all directions, and the tip of these arms each is equipped with a wafer holder for holding a silicon wafer.

In this case, the heat generates upon ion beam-shooting of wafers carried out in the ion implantation apparatus to cause deterioration in the photoresist layer formed on each wafer. For preventing such deterioration, it is necessary to cool the wafers to 100° C. or below.

Therefore, it has generally been carried out to cool the wafer holding wheel by circulating a coolant therein. However, the thermal conductivity at the interface between the wafer and the wafer holder shows a sharp drop in a vacuum, so that effective cooling of wafers cannot be achieved merely by circulating a coolant in a wafer holding wheel.

For the purpose of improving the physical contact between the wafer and the wafer holder, the use of a thermally conductive polymer on the wafer holder surface has been proposed, and carried into actual practice. For instance, the inert polymer thin film having tackiness is disclosed in U.S. Pat. No. 4,139,051, and the thermally conductive silicone rubber layer is disclosed in U.S. Pat. No. 4,282,924.

As to the method for supporting a wafer on a wafer holder, on the other hand, the method of fastening a wafer to a wafer holder with a ring laid on the periphery of the upper surface of the wafer has hitherto been put to practical use. However, such a method has a drawback of making it impossible to use the periphery of the wafer for a semiconductor device.

As another supporting method developed with the intention of giving up laying a fastening ring on the periphery of each wafer in order to use the whole surface of the wafer, centrifugal fastening has been put to practical use. In this method, each wafer revolves around a pivot as it is held on a wafer holder. And the angle between the pivot and each wafer holder surface is adjusted so that each wafer is pressed tightly against the wafer holder by the centrifugal force.

The art of utilizing both the foregoing centrifugal fastening method and thermally conductive polymer layer is disclosed in U.S. Pat. No. 4,832,781, and it is highly effective in holding and cooling wafers.

However, the use of thermally conductive silicone rubber for the foregoing thermally conductive polymer layer creates two problems. The first problem is that after ion implantation the wafer is stuck to the thermally silicone rubber surface and will not come loose; as a result, the wafer breaks if it is peeled away by force.

A cause of such tight adhesion of a silicon wafer to an elastic body is thought to be due to an electrostatic adsorption phenomenon arising from charges accumulated on the wafers by ion implantation.

The second problem is as follows: The elastic bodies according to conventional arts have an even surface, so that the wafer is mounted on such an elastic body in a state that almost all the back surface of the wafer is in close contact with the elastic body. When the wafer holding wheel is rotated at a high speed in order to implant ions into wafers, the centrifugal force generated thereby causes the slippage of the wafer on the elastic body; as a result, the elastic body is abraded to form particles, and these particles adhere to the back surface of the wafer.

Considering that improvements in yield and throughput are important to the semiconductor manufacturing process, the aforementioned first problem is a big problem, so the solution thereof has been desired.

The second problem described above gives rise to an apprehension that the cleaning tank used in the cleaning step subsequent to the ion implantation step is polluted with the particles or the particles on the back side of a wafer move around to the front side of the wafer.

SUMMARY OF THE INVENTION

Therefore, a first object of the invention is to provide a wafer holder installed in an ion implantation apparatus, which enables sufficient reduction of the heat generating in the wafer during the ion implanting operation to protect the resist layer of the wafer and ensures consistent operation in the apparatus by preventing the wafer from tightly contacting with the elastic body surface by electrostatic adsorption arising from charges accumulated on the wafer during the ion implantation.

A second object of the invention is to provide a wafer holder installed in an ion implantation apparatus, which can decrease the number of particles adhering to a wafer when the wafer is mounted on the surface of an elastic body.

The aforementioned objects of the invention are attained with wafer holders which are disposed in the target chamber of an ion implantation apparatus, with the wafer holders each comprising a wafer mount and an electrically conductive elastic body that is laid on the wafer mount and has a surface for holding a wafer thereon, wherein the surface of the elastic body preferably has a shape enabling a partial contact with the wafer held thereon.

The symbols on FIG. 1 to 8 denote the following members:
10 Ion implantation apparatus
18 Target chamber
20 Wafer holding wheel
28 Arm
28b Wafer support member
30 Wafer mount
44, 44A, 44B, 44C Elastic body
44a, 44Aa, 44Ba Small projections
44Ca Projection
W Wafer

DETAILED DESCRIPTION OF THE INVENTION

The present invention is illustrated below in detail by reference to the drawings.

Figure 1:
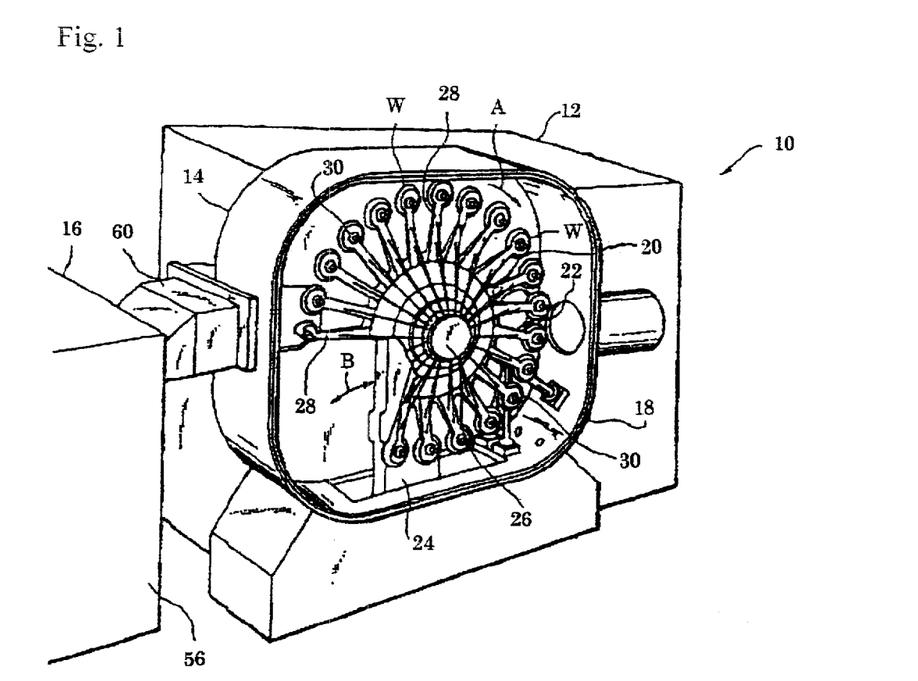
FIG. 1 is an oblique view showing a main part of the interior of an ion implantation apparatus relating to the invention.

FIG. 1 is an oblique view showing a main part of the interior of an ion implantation apparatus according to the invention. The ion implantation apparatus 10 is equipped with a beam line part 12 which generates ion beams, and a wafer loader part 16 which supplies silicone wafers to be processed with ion beams from the beam line part 12.

The ion beam line part 12 is comprised of an ion source section, an ion beam draw-out • first acceleration section, a mass analyzer section and a second acceleration section, though these sections are not shown in FIG. 1. The ion source section is designed so as to create the state of high-density plasma by discharging a doping gas sent from a gas supply source. In the ion beam draw-out • first acceleration section, the foregoing plasma is drawn out as ion beams and accelerated by the potential difference between this section and the ion source section. The desired ion species are set aside out of these ion beams in the mass analyzer section, and accelerated in the second acceleration section, followed by injection into an ion implantation part 14.

The ion implantation part 14 is equipped with a box-type target chamber 18 (inside which a vacuum can be created) and a wafer holding wheel 20 installed in the target chamber 18. One of the walls of the target chamber 18 has an opening 22, and the ion beams from the beam line part 12 are injected via the opening 22.

The wafer holding wheel 20 is comprised of a rocking shaft 24 installed in the target chamber 18 so that it can cause a rocking motion, a hub 26 which is set so that it is in contact with the top of the rocking shaft 24, and that rotatable, and arms 28 radiating from the hub 26 in all directions. The tip of these arms 28 each is equipped with a wafer holder for holding a wafer W. The hub 26 is set in rotary motion in the direction of the arrow A of FIG. 1, and the rocking shaft 24 is made to sway between the prescribed angles in the direction of the arrow B of FIG. 1. As a result, the wafer held on each wafer holder is made to cross the ion beams from the beam line part 12, and at the time of crossing the whole surface of the wafer is irradiated with the ion beams to undergo ion implantation.

Figure 2:
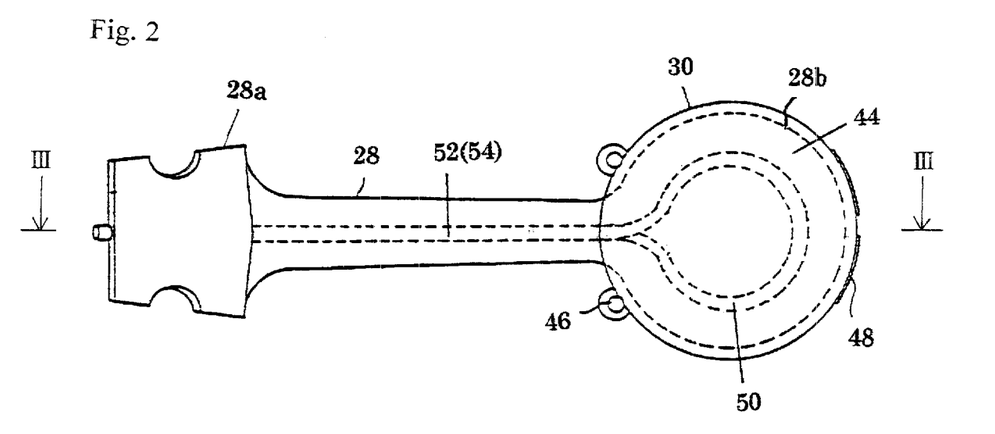
FIG. 2 is an enlarged diagram of a wafer holder according to one practical form of the invention, which is attached to a wheel arm.
Figure 3:
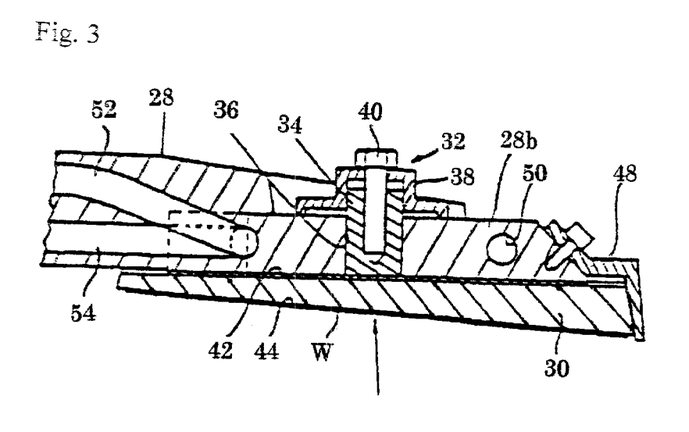
FIG. 3 is a cross sectional view of the wafer holder taken on the III—III line of FIG. 2.

FIG. 2 is an enlarged diagram of a wafer holder attached to a wheel arm 28. The arm 28 has on its base a joint part 28a united with the hub 26. The tip of the arm 28 is equipped with a circular wafer support member 28b for installation of a wafer W. And, as shown in FIG. 3, a circular wafer mount 30 made of an electrically conductive metal is fixed to the wafer support member 28b with a fixing member 32.

As to the fixing member 32, a stud 34 attached to the back side of the wafer mount 30 is inserted in a hole 36 drilled in the center of the wafer support member 28b, and a male bolt 40 is screwed into a hole formed inside the stud 34 via a washer 38. Thereby, the wafer support member 28b is pressed against the wafer mount 30 and fixed thereto. Further, a thermally conductive elastic material 42 is put between the wafer support member 28b and the wafer mount 30 to enable satisfactory thermal conduction to each other.

On the front side of the wafer mount 30, an electrically conductive elastic body 44, such as a sheet-form electrically conductive silicone rubber, is installed. And a wafer W is mounted on the surface of the electrically conductive elastic body 44 (hereinafter referred simply to as "elastic sheet 44"). When a wafer W is mounted on the surface of the elastic sheet 44, good thermal conductivity can be provided between the wafer W and the wafer mount 30.

Figure 4:
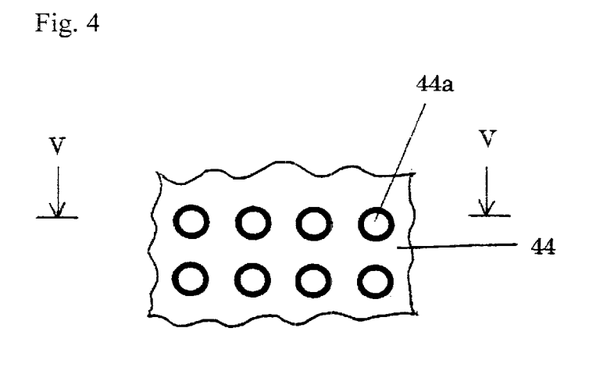
FIG. 4 is a top view of the elastic body shown in FIG. 2.
Figure 5:
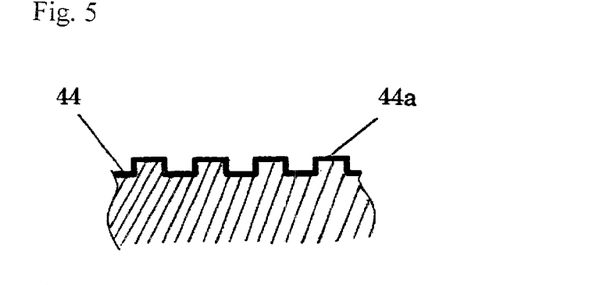
FIG. 5 is a cross sectional view of the elastic body taken on the V—V line of FIG. 4.

On the surface of the elastic sheet 44, as shown in FIG. 4 and FIG. 5, it is desirable that many small circular timber-form projections 44a be formed. By the formation of such projections, the area of the wafer brought into close contact with the elastic sheet when the wafer is mounted on the elastic sheet is decreased, compared with the projections-free conventional cases. As the abrasion of the elastic sheet due to the centrifugal force generating upon high-speed rotation of the wafer mount decreases with a decrease in the contact area, the particles brought about on the elastic sheet are reduced in number. As a result, the particles adhering to the back side of the wafer are also reduced in number.

The diameter of those small projections 44a is, e.g., of the order of 200 $\mu$m, and it is desirable that the ratio of the contact area between the wafer W and the elastic sheet 44 in the state of mounting the wafer W thereon to the total area of the wafer W be from about $\frac{1}{20}$ to about $\frac{1}{2}$, preferably from $\frac{1}{10}$ to $\frac{1}{3}$. The height of the small projections 44a is about 100 $\mu$m. By forming small projections which fit the above conditions, the number of particles adhering to the back side of a wafer can be certainly decreased without spoiling the effective cooling of the wafer. Besides a circular timber-form, the small projections maybe shaped into a striped pattern. Additionally, they are formed by the press forming, e.g., using a mold.

The wafer support member 28b has at least one wafer binding tool 46 with a spring tool which is not shown in FIG. 3) on one end and at least one stopper 48 on the other end. When the wafer W is loaded on the surface of an elastic sheet 44, the spring of the wafer binding tool 46 pushes the wafer against the stopper 48 to protect the wafer from coming off the elastic sheet 44.

Further, the cooling channel 50 is formed inside the wafer support member 28b. And this cooling channel 50 is connected to both cooling channel 52 for supply of water and cooling channel 54 for return of water, which are formed from the base part to the top part of the arm 28.

When the wafer W is mounted on the surface of the elastic sheet 44, the cooling water is made to flow into the cooling channel 50 from the cooling channel 52 for supply of water to cool the wafer W effectively, because the elastic sheets 42 and 44 disposed between the wafer W and the wafer support member 28b can improve the thermal conduction from the wafer support member 28b to the wafer W.

The wafer loader part 16 is placed in close vicinity of the target chamber 18. The housing 56 of the wafer loader part 16 and the target chamber 18 are connected together by a transportation path 58. The isolation bulb 60 is set at a certain point along the transportation path 58 so that the housing 56 and the target chamber 18 can be separated.

In carrying out the ion implantation with an ion implantation apparatus 10 constituted as mentioned above, the wafers W stored in a cassette (which is not shown in FIG. 1) of the wafer loader part 16 are transported one after another into the target chamber 18 with the aid of a robot (which is not shown in FIG. 1, too), and each wafer transported is mounted on the elastic sheet 44 laid on the wafer mount 30 attached to each tip of the arms of the wafer holding wheel 20. Then, the wafer holding wheel 20 is made to revolve in the direction of the arrow A on FIG. 1, and at the same time it is made to rock in the direction of the arrow B on FIG. 1. During such motions, the front surface of each wafer is irradiated with ion beams to effect the ion implantation.

In a special case where small circular timber-form projections 44a are formed on the surface of the elastic sheet 44 so that the contact area between the wafer W and the elastic sheet 44 in the state of mounting the wafer thereon is from about 1/20 to about 1/2 of the total area of the wafer W, the amount of abrasion caused in the elastic sheet 44 by the centrifugal force generating upon high-speed rotation of the wafer holding wheel 20 is reduced to decrease the number of particles formed on the elastic sheet 44. As a result, the number of the particles adhering to the back side of each wafer W decreases.

In accordance with the invention, therefore, the pollution of a cleaning tank in the cleaning step subsequent to the ion implantation step and the transfer of particles from the back surface of each wafer W to the front surface thereof in the cleaning tank can be prevented. Therefore, the conventional step of cleaning the back surface of each wafer with a brush can be omitted. Further, as the contact between the elastic sheet 44 and the wafer W is secured to a certain degree, the cooling effect on each wafer is hardly impaired.

Figure 6:
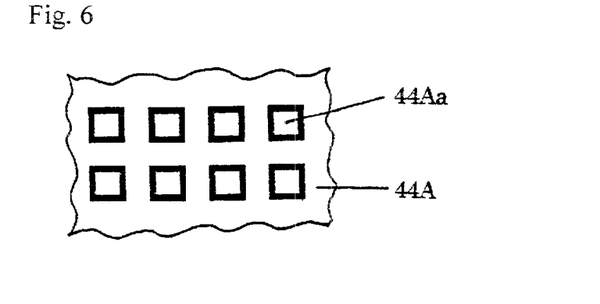
FIG. 6 is a top view of the elastic body of a wafer holder according to another practical form of the invention.

In another embodiment according to the invention, which is shown in FIG. 6, the wafer holder is equipped with an elastic sheet 44A having small square timber-form projections 44Aa formed on the surface thereof. The other constituent elements are the same as in the aforementioned embodiment. In this case also, the number of particles adhering to the back side of wafer W can be reduced without impairing cooling effect on the wafer W.

Figure 7:
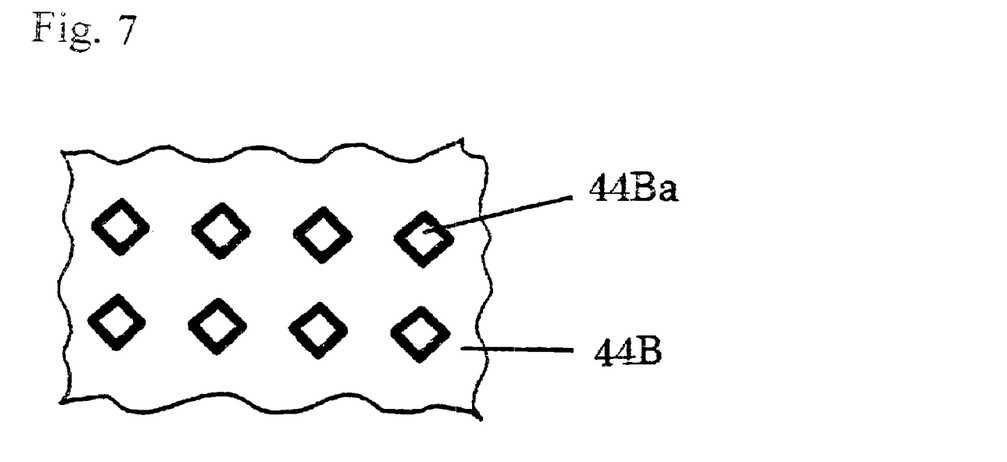
FIG. 7 is a top view of the elastic body of a wafer holder according to still another practical form of the invention.

In still another embodiment according to the invention, which is shown in FIG. 7, the wafer holder is equipped with an elastic sheet 44B having small rhombic timber-form projections 44Ba formed on the surface thereof. The other constituent elements are the same as in the aforementioned embodiments. In this case also, the effect of decreasing the number of particles adhering to the back side of wafer W can be achieved without impairing cooling effect on the wafer W.

Figure 8:
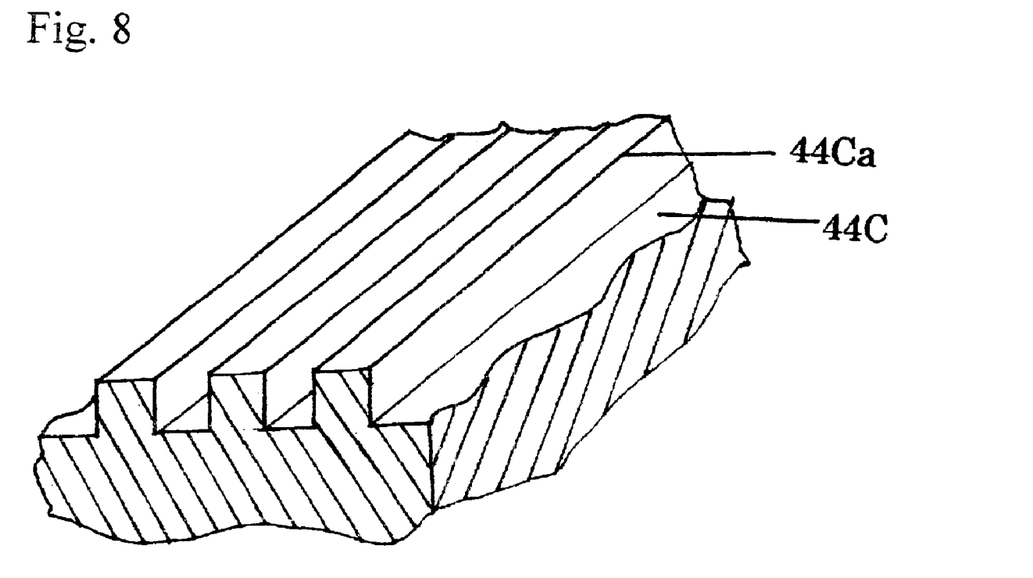
FIG. 8 is an oblique view of the elastic body of a wafer holder according to a further practical form of the invention.

In a further embodiment according to the invention, which is shown in FIG. 8, the wafer holder is equipped with an elastic sheet 44C having long linear projections 44Ca arranged in rows on the surface thereof. The other constituent elements are the same as in the aforementioned embodiments. In this case also, the effect of decreasing the number of particles adhering to the back side of wafer W can be achieved without impairing cooling effect on the wafer W. Needless to say, the shape of projections 44Ca should not be construed as being limited to the straight line, but it may be a curved line.

Additionally, the elastic sheet 44 has small timber-form projections or striped projections on its surface in the present embodiments mentioned above. However, the elastic sheet has no particular restrictions as to its surface shape so far as it has electric conductivity.

On the other hand, it is desirable that the average thickness of the electrically conductive elastic sheet be from 50 to 1,000 $\mu$m. When the elastic sheet has an average thickness smaller than 50 $\mu$m, it is short of sheet strength, and so it is likely to have poor durability. On the other hand, the average thickness greater than 1,000 $\mu$m causes an increase of thermal resistance to lower the wafer cooling efficiency; as a result, there is a fear of a wafer temperature rise as to make the temperature control impossible.

The electrically conductive elastic body usable in the invention comprises an elastic material and an electric conductivity imparting agent. Examples of an elastic material include silicone rubber, EP(DM) rubber, NBR, IR, SBR and urethane rubber. Of these electrically conductive elastic bodies, electrically conductive silicone rubber is preferred over the others. More specifically, the cured silicone rubber composition is used to particular advantage, which is constituted of (1) 100 parts by weight of diorganopolysiloxane represented by the average compositional formula $R_nSiO_{(4-n)/2}$ (wherein R represents a substituted or unsubstituted univalent hydrocarbon group, and n is a positive number of from 1.95 to 2.05), (2) 5 to 100 parts by weight of electrically conductive carbon black and (3) a curing agent.

When the electrically conductive elastic sheet having a flat surface is used, it is desirable that the surface roughness (Rz) of the sheet be adjusted to the range of 1 to 100 $\mu$m, especially 3 to 50 $\mu$m. As mentioned above, the formation of small timber-form projections or striped projections on the elastic sheet surface is preferable. In particular, it is advantageous that the contact area between the wafer W and the elastic sheet in the state of mounting the wafer thereon be from about 1/20 to about 1/2 of the total area of the wafer W.

The suitable hardness of the electrically conductive elastic sheet is from 10 to 90, preferably from 30 to 70, measured according to JIS-A (the method for measuring hardness defined in JIS K6301).

When the elastic sheet has hardness lower than 10, it is short of elastic strength, and so it is likely to have poor durability. On the other hand, when the hardness is higher than 90, the elastic sheet undergoes only small elastic deformation by centrifugal tightening force to fail in securing sufficient contact area. As a result, the wafer cooling efficiency is lowered, and so the wafer temperature is raised to make the temperature control impossible. Therefore, there is a fear that the deterioration of resist layer is caused to lower the yield of integrated circuits.

Furthermore, it is desirable for the invention that the volume resistivity of the electrically conductive elastic sheet be 1,000 $\Omega \cdot$cm at the highest, preferably from 0.01 to 500 $\Omega \cdot$cm. When the elastic sheet has a volume resistivity higher than 1,000 $\Omega \cdot$cm, it tends to impede efficient transmission of the charges accumulated on the silicon wafer to the ground and fail in preventing the silicon wafer from clinging to the wafer holder by electrostatic adsorption phenomenon.

As mentioned above, it is desirable to form projections on the elastic sheet surface so that the contact area between the elastic sheet and the wafer W in the mounted state is controlled to the range of about 1/20 to about 1/2 of the whole area of the wafer W. The contact area between the elastic sheet and the wafer W can be reduced by decreasing the diameter of each projection or the number of projections, and thereby the number of particles adhering to the back side of wafer W can be further reduced.

Then, the electrically conductive silicone rubber described above as an especially advantageous electrically conductive elastic body is illustrated below in detail.

Examples of R in the average compositional formula $R_nSiO_{(4-n)/2}$ representing diorganopolysiloxane (wherein R is a substituted or unsubstituted univalent hydrocarbon group and n is a positive integer of from 1.95 to 2.05) include an alkyl group, such as methyl, ethyl or propyl; a cycloalkyl group, such as cyclopentyl or cyclohexyl; an alkenyl group, such as vinyl or allyl; an cycloalkenyl group; an aryl group, such as phenyl or tollyl; and the groups formed by substituting halogen atoms or cyano groups for a part or all of the hydrogen atoms in the above-recited groups, such as 3,3,3-trifluoropropyl and cyanoethyl.

Suitable examples of diorganopolysiloxane represented by the foregoing average compositional formula include dimethylpolysiloxane the main chain of which is constituted of dimethylsiloxane units and diorganopolysiloxane whose main chain is a dimethylpolysiloxane chain into which phenyl, vinyl or/and 3,3,3-trifluoropropyl groups are introduced.

Further, it is desirable for those diorganopolysiloxanes to contain at least two alkenyl groups per molecule. The suitable polymerization degree of such diorganopolysiloxanes is at least 2,000, preferably from 3,000 to 20,000. When the diorganopolysiloxane has a polymerization degree lower than 2,000, there is a fear that it neither has satisfactory workability and moldability nor ensures sufficient mechanical strength for the molding.

Examples of electrically conductive carbon black as the second component include acetylene black, conductive furnace black, super conductive furnace black, extra conductive furnace black, conductive channel black, and furnace black or channel black which has undergone heat treatment at a high temperature of about 1,500° C.

Examples of acetylene black available as a product include Denka Acetylene Black (trade name, a product of Denki Kagaku Co., Ltd.) and Shawnigun Acetylene Black (trade name, a product of Shawnigun Chemical Co., Ltd.), and those of conductive furnace black available as a product include Continex CF (trade name, a product of Continental Carbonic Inc.) and Vulcan C (trade name, a product of Cabot Corporation)

Examples of super conductive furnace black available as a product include Continex SCF (trade name, a product of Continental Carbonic Inc.) and Vulcan SC (trade name, a product of Cabot Corporation), and those of extra conductive furnace black available as a product include Asahi HS-500 (trade name, a product of Asahi Carbon Co., Ltd.) and Vulcan XC-72 (trade name, a product of Cabot Corporation).

As an example of conductive channel black, Coalux L (trade name, a product of Degussa Co., Ltd.) can be cited. And Ketjen Black EC and Ketjen Black EC-600JD (trade names, products of Ketjen Black International Co., Ltd.) are available as furnace black products. Additionally, acetylene black is used to particular advantage in the invention because it is only slightly contaminated with metal impurities and metal ion impurities.

It is desirable that the electrically conductive carbon black be added in an amount of 5 to 100 parts by weight, preferably 10 to 75 parts by weight, per 100 parts by weight of the organopolysiloxane component mentioned above.

When the conductive carbon black is added in an amount smaller than 5 parts by weight, it cannot produce sufficient effect upon the prevention of electrostatic adsorption of the wafer onto the wafer holder; while when the addition amount thereof is increased beyond 100 parts the mechanical strength of the cured composition is lowered and the thermal resistance between the wafer and the cured composition is increased to lower the cooling efficiency.

The curing agent as the third component can be selected properly from radical reaction initiators and addition reaction curing agents usually used for vulcanizing and curing conductive silicone rubber. Examples of a radical reaction initiator usable for the foregoing purpose include organic peroxides, such as di-t-butyl peroxide, 2,5-dimethyl-2,5-di(t-butylperoxy)hexane, 2,5-dimethyl-2,5-di(t-butylperoxy) hexene and dicumyl peroxide. These organic peroxides is generally used in an amount of 0.1 to 5 parts by weight per 100 parts by weight of diorganopolysiloxane.

When the diorganopolysiloxane used contains at least two alkenyl groups attached to silicon atoms in one molecule, the curing can be effected by addition reaction also.

As an addition reaction curing agent, the combination of organohydrogenpolysiloxane containing at least two hydrogen atoms attached to silicon atoms and a platinum catalyst can be employed. It is desirable that such organohydrogenpolysiloxane is used in an amount of 0.5 to 5 moles, based on the silicon-attached hydrogen atoms therein, per mole of alkenyl groups contained in the diorganopolysiloxane. The platinum catalyst may be used in a catalytic amount. Usually, the proportion of the platinum catalyst is from 0.1 to 2,000 ppm to the diorganopolysiloxane.

For imparting good thermal conductivity to the electrically conductive elastic body used in the invention, the ceramic powder having high thermal conductivity, such as alumina, aluminum nitride, boron nitride, silicon nitride, magnesium oxide or silica powder, may be added as a filler besides an electric conductivity providing agent such as conductive carbon black. It is desirable that such a filler be added to the electrically conductive elastic body in an amount required for imparting thereto a thermal conductivity of at least 0.001 cal/cm·sec·°C., especially 0.002 cal/cm·sec·°C. When the elastic body has a thermal conductivity lower than 0.001 cal/cm·sec·°C., it cannot ensure enough cooling efficiency to prevent a rise in wafer temperature and keep the wafer temperature constant; as a result, the resist layer on the wafer is liable to deterioration, and the yield of integrated circuits tends to decrease.

The installation of the present electrically conductive elastic body on the wafer mount 30 made of metal can be carried out in a way that the electrically conductive elastic body sheet is bonded to the wafer mount made of metal by the use of a known moisture-curable or addition reaction-curable silicone rubber adhesive, or a way of coating a silane or titanium primer on the surface of the wafer mount made of metal, putting thereon the pre-foam of uncured electrically conductive elastic body, and then subjecting them to hot press molding to unite them in a body.

In accordance with the present invention, the wafer holder installed in an ion implantation apparatus is equipped with an elastic body having electric conductivity, and thereby it becomes possible not only to dissipate the heat generated during ion implantation into the silicon wafer in a vacuum by way of the wafer mount but also to efficiently transmit the charges accumulated on the silicon wafer to the ground to inhibit the electrostatic adsorption phenomenon. Therefore, the wafer can be easily attached to and detached from the wafer holder before and after ion implantation. Moreover, the number of particles attached to the back side of the ion-implanted wafer can be reduced, and thereby the yield of semiconducting device products can be considerably improved and the device performance can also be elevated.

The entire disclosure of all applications, patents and publications, cited above and below, and of corresponding Japanese Application No. 10-362302, filed on Dec. 21, 1998, is hereby incorporated by reference.

Now, the present invention is illustrated in more detail by reference to the following examples. However, the invention should not be construed as being limited to these examples.

EXAMPLES 1 TO 3

The silicone rubber compositions for Examples 1 to 3 were prepared using the ingredients shown in Table 1 in their respective amounts also set forth in Table 1. The ingredients used were selected from the following;

A: Methylvinylpolysiloxane constituted of 99.85 mole % of dimethylsiloxane units and 0.15 mole % of methylvinylsiloxane units and having an average polymerization degree of 8,000
B: Di-t-butyl peroxide
C: Denka Acethylene Black
D: Ketjen Black EC-600JD
E: Continex SCF
F: Fumed silica surface-treated with hexamethyldisilazane (specific surface area: 200 g/m$^2$)

Each of the compositions was made into a pre-foam sheet, and then subjected to 30 minutes press molding under press pressure of 3 kgf/cm$^2$ at 170° C. Further, the molding obtained was placed in an oven and underwent post-cure for 2 hours at 230° C. Thus, electrically conductive silicone rubber sheets were obtained.

The rubber sheets obtained were each examined for hardness (according to JIS K6301), surface roughness (according to JIS B0601), volume resistivity (according to JIS C2123) and thickness. The measurement results are shown in Table 1.

TABLE 1

|  | Example 1 | Example 2 | Example 3 |
|---|---|---|---|
| A | 100 pts.wt. | 100 pts.wt. | 100 pts.wt. |
| B | 3 pts.wt. | 3 pts.wt. | 3 pts.wt. |
| C | 70 pts.wt. | 0 | 0 |
| D | 0 | 60 pts.wt. | 0 |
| E | 0 | 0 | 55 pts.wt. |
| Cured sheet hardness (JIS-A) | 60 | 55 | 50 |
| Surface roughness Rz (μm) | 8 | 6 | 5 |
| Volume resistivity (Ω.cm) | 3 | 10 | 50 |
| Sheet thickness (μm) | 500 | 250 | 100 |

On the wafer mount made of aluminum (φ=200, angle of inclination to the plane perpendicular to the rotational axis= 7°), the moisture-curable silicone adhesive, KE3491 (the trade name, a product of Shin-Etsu Chemical Co., Ltd.) was coated so as to have a thickness of 10 μm by the use of a screen printing method, and thereto each of the conductive silicone sheets having the physical properties as shown in Table 1 was bonded in a vacuum by means of a vacuum presser, followed by standing for 7 days at room temperature in the atmosphere. Thus, wafer holder samples differing in conductive silicone layer formed therein were obtained.

Each of the thus obtained wafer holder samples was attached to an ion implanting apparatus of centrifugal fastening type, and the city water (20° C.) was circulated as the coolant of heat exchanger. The ion implantation was carried out for 10 minutes under a condition that the revolving speed for centrifugal fastening was adjusted to 1,500 r.p.m. and the power input to each 8-inch silicon wafer was adjusted to 3,000 W (ion beam current: 0.05 A, ion beam acceleration voltage: 60 keV). As a result, each wafer had a little rise in temperature as shown in Table 2, namely the testing results were satisfactory. Further, the wafers were easily peeled apart from their respective wafer holders after ion implantation, and no difficulty in wafer peeling was caused even after continuous ion-implantation processing of 50,000 wafers.

TABLE 2

|  | Example 1 | Example 2 | Example 3 |
|---|---|---|---|
| Wafer Temperature during ion implantation (° C.) | 50 | 45 | 35 |

COMPARATIVE EXAMPLES 1 AND 2

On the wafer mount made of aluminum (φ=200, angle of inclination to the plane perpendicular to the rotational axis= 7°), similarly to the cases of Examples 1 to 3, the moisture-curable silicone adhesive, KE45 (the trade name, a product of Shin-Etsu Chemical Co., Ltd.) was coated so as to have a thickness of 10 μm by the use of a screen printing method, and thereto each of the insulating silicone sheets having the physical properties as shown in Table 3 was bonded in a vacuum by means of a vacuum presser, followed by standing for 7 days at room temperature in the atmosphere. Thus, comparative wafer holder samples differing in thermally conductive silicone layer formed therein were obtained.

TABLE 3

|  | Comparative Example 1 | Comparative Example 2 |
|---|---|---|
| A | 100 pts.wt. | 100 pts.wt. |
| B | 3 pts.wt. | 3 pts.wt. |
| C | 3 pts.wt. | 0 |
| F | 10 pts. Wt. | 20 pts.wt. |
| Cured sheet hardness (JIS-A) | 45 | 50 |
| Surface roughness Rz (μm) | 5 | 10 |
| Volume resistivity (Ω.cm) | 1 × 10$^{15}$ | 1 × 10$^{16}$ |
| Sheet thickness (μm) | 250 | 250 |

Each of the thus obtained wafer holder samples for comparison was attached to the ion implanting apparatus of centrifugal fastening type, and the city water (20° C.) was circulated as the coolant of heat exchanger. The ion implantation was carried out for 10 minutes under a condition that the revolving speed for centrifugal fastening was adjusted to 1,500 r.p.m. and the power input to each 8-inch silicon wafer was adjusted to 3,000 W (ion beam current: 0.05 A, ion beam acceleration voltage: 60 keV). The results of tests on wafer temperature and wafer peelability are shown in Table 4. As can be seen from Table 4, each wafer holder developed troubles in peeling wafer apart therefrom.

TABLE 4

|  | Comparative Example 1 | Comparative Example 2 |
|---|---|---|
| Wafer temperature during ion implantation (° C.) | 40 | 43 |
| Wafer peelability during ion implanting operation | Impossible to peel 20th wafer apart from holder | Impossible to peel 10th wafer apart from holder |

Furthermore, the following experiments were made using the ion implantation apparatus as shown in FIG. 1.

On two among the wafer mounts installed on the tips of the arms of the wafer holding wheel 20, two thermally conductive silicone rubber sheets having a flat surface (sheets prepared according to Comparative Example 1, which are hereinafter referred to as "conventional elastic sheets") were laid respectively; while on the other two wafer mounts were laid respectively two electrically conductive silicone rubber sheets having on the surface a lot of small timber-form projections shown as 44a in FIGS. 4 and 5 (sheets prepared according to Example 2 and further underwent surface molding, which are hereinafter referred to as "present elastic sheets with timber-form projections"). Then, wafers were mounted on these four elastic sheets respectively, and the wafer holding wheel 20 were made to rotate for a prescribed time. Thereafter, the number of particles adhering to the back side of each wafer was examined. These operations for examining the particle adhesion were repeated 10 times. In examining the particle adhesion, only the particles having the size of at least 0.3 μm were counted.

Figure 9:
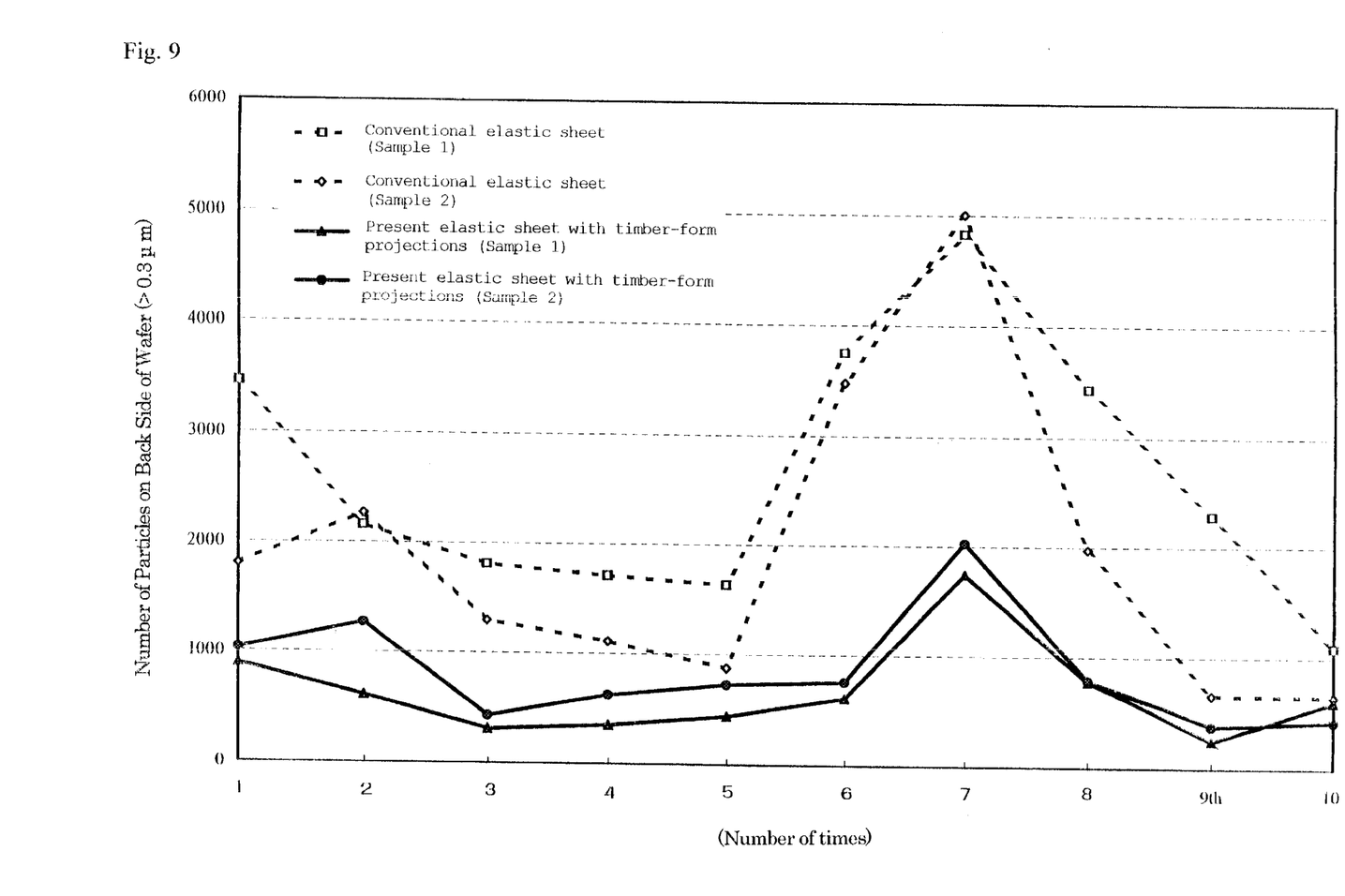
FIG. 9 is a graph showing the measurement results of the number of particles adhering to wafers on their back sides in the case of using the elastic body shown in FIG. 4 together with the measurement results of the number of particles adhering to wafers on their back sides in the case of using a conventional elastic body.

The examination results are shown in FIG. 9. Therein, the solid lines each represent the numbers of particles adhering to the wafers mounted on the present elastic sheets with timber-form projections, while the dotted lines each represent the numbers of particles adhering to the wafers mounted on the conventional elastic sheets. These line graphs indicate that the number of particles in the case of using the present elastic sheet with timber-form projections is from about ⅓ to about ½, based on the average of 10 measurements, of the number of particles in the case of using the conventional elastic sheet.

When the wafer is mounted on an elastic sheet surface having small projections, the contact area between the elastic sheet and the back surface of the wafer is small, compared with the conventional case in which the elastic sheet has a flat surface. Such reduction in contact area excited considerable apprehension about the wafer cooling efficiency. However, it has been proved by carrying out the experiments mentioned above that the cooling efficiency of the elastic sheet with small projections was almost the same as that of the elastic sheet with a flat surface from the practical point of view.

What is claimed is:

1. A wafer holder which is installed in the target chamber of an ion implantation apparatus, comprising a wafer mount and an electrically conductive elastic body that is laid on the wafer mount and has a surface for holding a wafer thereon, wherein the electrically conductive elastic body has a ten-point mean roughness $R_z$ of 1 to 100 μm at the surface for holding a wafer, a thickness of 50 to 1000 μm and a volume resistivity not to exceed 1000 Ω·cm, and wherein said electrically conductive elastic body has a surface shape whereby the total contact area between the electrically conductive elastic body surface and a wafer mounted on the electrically conductive elastic body is from about 1/20 to about ½ of the total area of the wafer.

2. A wafer holder according to claim 1, wherein said electrically conductive elastic body has a surface shape whereby the total contact area between the electrically conductive elastic body surface and a wafer mounted on the electrically conductive elastic body is from 1/20 to ½ of the total area of the wafer.

3. A wafer holder which is installed in the target chamber of an ion implantation apparatus, comprising a wafer mount and an electrically conductive elastic body that is laid on the water mount and has a surface for holding a wafer thereon, wherein said electrically conductive elastic body has projections on the surface, the top surface of each of the projections has a shape enabling a contact with a wafer when the wafer is mounted on the electrically conductive elastic body and the total contact area between the electrically conductive elastic body surface and a wafer in a state that the wafer is mounted on the electrically conductive elastic body is from about 1/20 to about ½ of the total area of the wafer.

4. A wafer holder according to claim 3, wherein the electrically conductive elastic body has a volume resistivity not to exceed 1000 Ω·cm.

5. A wafer holder according to claim 3, wherein the projections are about 200 μm in diameter and about 100 μm in height.

6. A wafer holder according to claim 3, wherein said electrically conductive elastic body is an electrically conductive elastic sheet having a thickness of 50–1,000 μm.

7. A wafer holder which is installed in the target chamber of an ion implantation apparatus, comprising a wafer mount and an electrically conductive elastic body that is laid on the wafer mount and has a surface for holding a wafer thereon, wherein the electrically conductive elastic body has a ten-point mean roughness $R_z$ of 1 to 100 μm at the surface for holding a wafer, a thickness of 50 to 1000 μm and a volume resistivity not to exceed 1000 Ω·cm, and wherein said electrically conductive elastic body has surface shape whereby the total contact area between the electrically conductive elastic body surface and a wafer mounted on the electrically conductive elastic body is 1/10 to ⅓.

* * * * *